(12) United States Patent
Kawaguchi et al.

(10) Patent No.: US 7,514,722 B2
(45) Date of Patent: Apr. 7, 2009

(54) WHITE LED ILLUMINATION DEVICE

(75) Inventors: Yoshifumi Kawaguchi, Tokyo (JP);
Katsumi Kobinata, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 36 days.

(21) Appl. No.: 11/561,544

(22) Filed: Nov. 20, 2006

(65) Prior Publication Data

US 2007/0114551 A1 May 24, 2007

(30) Foreign Application Priority Data

Nov. 18, 2005 (JP) ............................. 2005-334311

(51) Int. Cl.
*H01L 33/00* (2006.01)

(52) U.S. Cl. ............................. 257/98; 257/79; 257/99; 257/E33.068; 257/E33.073

(58) Field of Classification Search .................. 257/79, 257/98, 99, E33.068, E33.073
See application file for complete search history.

(56) References Cited

U.S. PATENT DOCUMENTS

| 6,547,423 | B2 * | 4/2003 | Marshall et al. ............. 362/333 |
| 2005/0146879 | A1 * | 7/2005 | Takahashi et al. ........... 362/296 |

FOREIGN PATENT DOCUMENTS

JP 2005216782 8/2005

* cited by examiner

*Primary Examiner*—Victor A Mandala
(74) *Attorney, Agent, or Firm*—Cermak Kenealy Vaidya & Nakajima LLP (57) ABSTRACT

A white LED illumination device can include a white LED that has unevenness in tone and is used as a light source. The white LED illumination device can emit white light with high color rendering properties without unevenness in tone and can include the above noted white LED located adjacent an optical lens. The white LED and optical lens can be arranged so that the optical axes of both are substantially aligned with each other. The white LED can include an LED chip which emits light having a peak wavelength in the blue wavelength range and a fluorescent material which can be excited by the light emitted from the LED chip to emit yellow or yellowish green fluorescence (i.e., complementary colors to blue) by use of wavelength conversion. The optical lens can have a recessed light incident surface having an opening, a light emitting surface, and a totally reflective surface positioned between the light incident surface and the light emitting surface. The inner bottom of the recessed light incident surface can include a convex shape having a convex surface. The light emitting surface can be composed of a convex portion having a center and a periphery that can be formed in different shapes or curvatures, and can include a flat surface surrounding the convex portion.

13 Claims, 3 Drawing Sheets

B: Bluish white light
Y: Yellowish white light

Fig. 5

B: Bluish white light
Y: Yellowish white light

Fig. 6

B: Bluish white light
Y: Yellowish white light

WHITE LED ILLUMINATION DEVICE

BACKGROUND

This application claims the priority benefit under 35 U.S.C. § 119 of Japanese Patent Application No. 2005-334311 filed on Nov. 18, 2005, which is hereby incorporated in its entirety by reference.

1. Field

The disclosed subject matter relates to a white LED illumination device, and in particular, relates to a white LED illumination device having a white LED as a light source. The white LED has an LED chip and a wavelength conversion material. The LED chip can emit light having a peak wavelength in, for example, the blue wavelength range. The wavelength conversion material such as a fluorescent material is excited by the light from the LED chip and performs wavelength conversion to emit, for example, yellow or yellowish green fluorescence which is a complementary color of blue.

2. Brief Description of the Related Art

LED chips generally emit light that has steep spectral characteristics (spectral distribution). Humans typically recognize the light as light with a tone approximately corresponding to its peak wavelength $\lambda p$ (wavelength at which maximum emission intensity is achieved). Accordingly, the LED chip emits light in an intrinsic tone caused by the material, composition, structure, and the like of the LED chip. This emitted light is generally not white light (natural light) with superior color rendering properties like that produced by the sun (which includes a wavelength component in a wide wavelength range throughout the ultraviolet, visible, and infrared regions).

There are some methods to obtain white light by using the LED chip emitting light with such spectral characteristics as a light source. In one method, three kinds of LED chips, that is, an LED chip emitting red light (red LED chip), an LED chip emitting green light (green LED chip), and an LED chip emitting blue light (blue LED chip) are employed. They are turned on at the same time, and as a result, white (W) light with a desired tone can be generated by means of additive color mixture. The tone can be adjusted by independently controlling the respective amounts of red (R) light, green (G) light, and blue (B) light which are the three primary colors and are emitted by the respective LED chips.

This method has a disadvantage in that three driving circuits are necessary to independently control the respective amounts of light emitted by the LED chips. However, there is also an advantage in that the tone of light generated by means of the additive color mixture can be successively controlled.

Another method uses a fluorescent material serving as a wavelength conversion material. This method utilizes a principle in which when a fluorescent material is irradiated with light, the fluorescent material is excited and emits light with a longer wavelength than that of the excitation light.

Specifically, for example, the fluorescent material such as YAG, TAG, or orthosilicate is available. When blue light (light having a peak wavelength in the blue wavelength range) is emitted from an LED chip made of a semiconductor material such as ZnSe, InGaN, GaN, ZnO, etc., excites the fluorescent material, the fluorescent material emits, via wavelength conversion, yellow and/or yellowish green fluorescence which are complementary colors of the blue light. Yellow light, which is generated by wavelength conversion when part of the blue light emitted from the LED chip excites the fluorescent material, can be added to or mixed with part of the blue light emitted from the LED chip to generate white light by means of the additive color mixture.

In another example, when an LED chip emits blue light, a mixture of two kinds of fluorescent materials can be employed, which emit green and red fluorescence, respectively, by wavelength conversion when excited by the blue light. Green light and red light, which are generated by wavelength conversion when part of the blue light emitted from the LED chip excites the fluorescent materials can be mixed with or added to part of the blue light emitted from the LED chip to generate white light by means of additive color mixture.

When an LED chip emits ultraviolet light, a mixture of three kinds of fluorescent materials can be employed, which emit blue, green, and red fluorescence, respectively, by wavelength conversion when excited by the ultraviolet light. Blue light, green light, and red light, which are generated by wavelength conversion when part of the ultraviolet light emitted from the LED chip excites the fluorescent materials, can be mixed together and generate white light by means of additive color mixture.

Furthermore, when the wavelength of light emitted from an LED chip and a kind of fluorescent material are appropriately selected and combined, light in various tones other than white light can also be generated.

Figure 1:
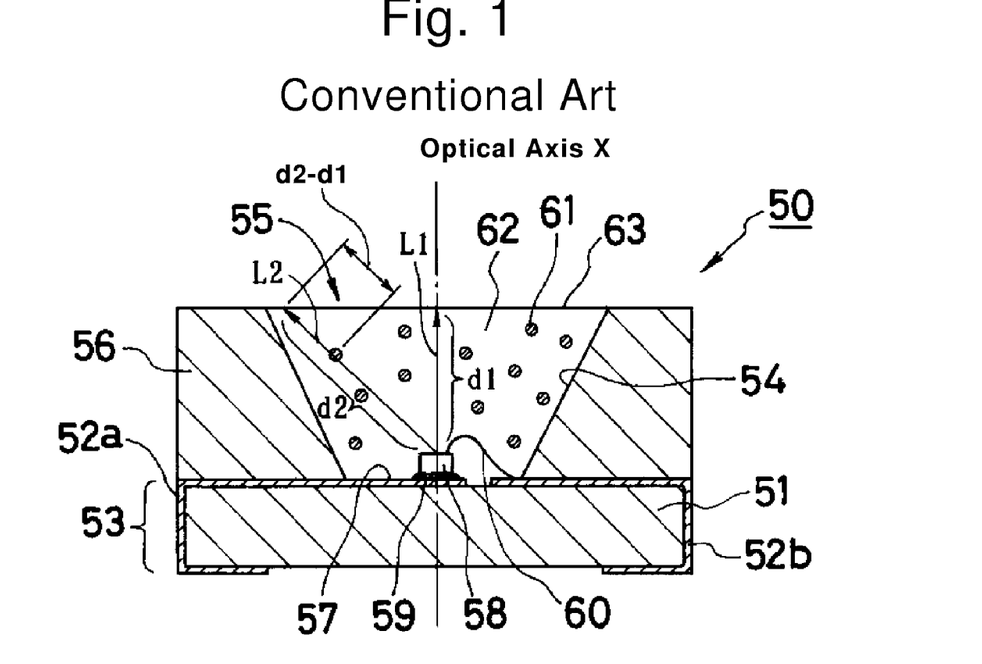
FIG. 1 is a sectional view of a conventional LED light source composed of an LED illumination device.

FIG. 1 is an example of such an LED. In this LED, part of the light emitted from a light source excites a fluorescent material for wavelength conversion and generates light different in tone from the light emitted from the light source. The LED has a printed circuit board 53 in which conductive patterns 52a and 52b are formed on an insulating substrate 51. A lamp house 56 is attached to the printed circuit board 53. The lamp house 56 is provided with a bowl-shaped recessed portion 55 having a reflective surface 54 opening upward and outward. A blue LED chip 58, which can emit blue light, is mounted on the conductive pattern 52a formed on an inner bottom 57 of the recessed portion 55 (on the printed circuit board 53) via a conductive adhesive 59 to electrically connect a lower side electrode of the blue LED chip 58 to the conductive pattern 52a. An upper side electrode of the blue LED chip 58 is electrically connected to the conductive pattern 52b through an overhead wired bonding wire 60. Furthermore, a transparent resin 62, into which a fluorescent material 61 is mixed, is filled into the recessed portion 55. The blue LED chip 58 and the bonding wire 60 are sealed by the resin to be shielded from air. In this instance, when the blue light excites the fluorescent material 61, the fluorescent material 61 can emit via wavelength conversion yellow or yellowish green fluorescence, which are complementary colors of blue.

In the LED 50 with such a structure, the light emitted from the blue LED chip 58 reaches a light emitting surface 63 through the transparent resin 62 into which the fluorescent material 61 is mixed. In this case, the optical path and optical path length of the light differ according to an emission direction of the light from the blue LED chip 58. To be more specific, when L1 represents light emitted from the blue LED chip 58 in an optical axis X direction (upward) of the blue LED chip 58 toward the light emitting surface 63, d1 represents its optical path length. L2 represents light emitted from the blue LED chip 58 in a slanting upward direction from the blue LED chip 58 toward the light emitting surface 63, and d2 represents its optical path length. L2 is longer than L1, and therefore, the difference of the optical paths is represented by d2-d1.

Such difference in the optical path means that there is difference in a ratio of wavelength conversion of the light from the blue LED chip 58 by the fluorescent material. In other words, the light L1 reaching the light emitting surface 63 through the short optical path has a blue tone because it is subjected to a low ratio of wavelength conversion by the fluorescent material. On the contrary, the light L2 reaching the light emitting surface 63 through the long optical path has a yellow tone because it is subjected to a high ratio of wavelength conversion by the fluorescent material.

Accordingly, this LED emits bluish white light in a front direction and emits yellowish white light in the slanting upward direction. Also, the bluish white light is emitted from the center of the light emitting surface of the LED and the yellowish white light is emitted from the periphery of the light emitting surface of the LED. Thus, the LED has an optical characteristic with an uneven tone because the emitted white light has different tones according to its emission direction and emission portion.

By the way, it is conventionally known that a light source that evenly emits light in every direction, like the above-described LED, is optically regarded as a point source of light. This is true when the size of the light source is much smaller than the distance from which it is observed (observation distance is approximately five times or more of the size of the light source).

Consider that an illumination device for illuminating a position that is approximately five times or more of the size of the light source away is configured using the above-described LED as a light source. In this case, it is necessary to secure the illuminance of an illumination surface and improve unevenness in the tone of the light source by applying certain light-gathering means to the wide directional light emitted from the light source.

Figure 2:
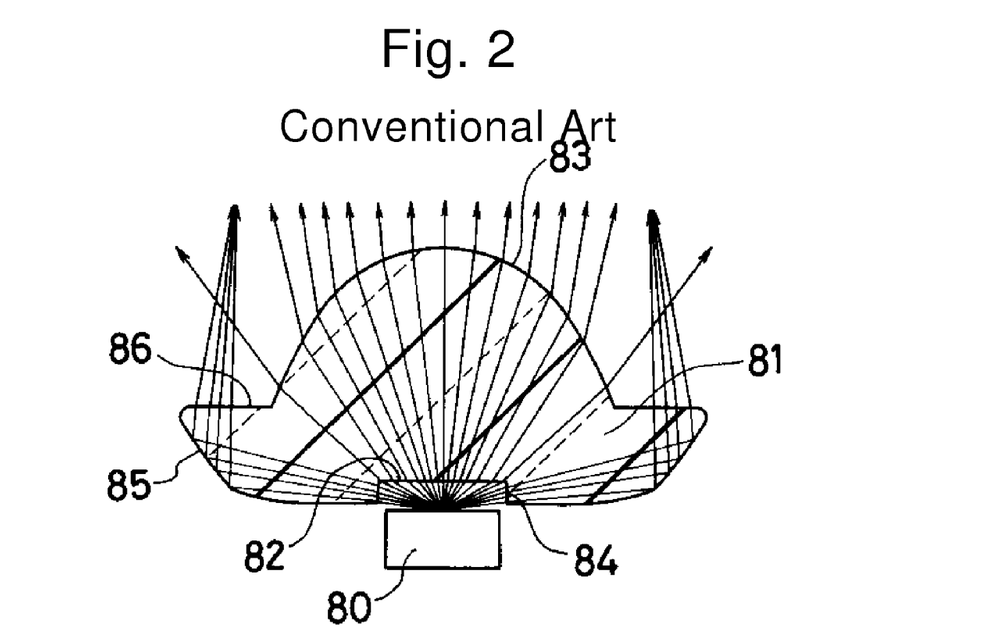
FIG. 2 is a sectional view of a conventional white LED illumination device and lens.

To cope with this, as shown in FIG. 2, there is an LED in which a condenser lens is provided in front of the LED in a light emission direction to collect the light to an illumination surface and even the tone of illumination light in the illumination surface.

Bluish white light emitted in a front direction of an LED 80 is refracted by an upper incident surface 82 of a lens 81 and introduced into the lens 81 while collected. The bluish white light reaches a center emitting surface 83 after passing through the lens 81, and is refracted by and gathered at the center emitting surface 83, and is emitted to the outside of the lens 81. Yellowish white light emitted in a side direction of the LED 80, on the other hand, is refracted by a side incident surface 84 of the lens 81 and introduced into the lens 81. The yellowish white light reaches a peripheral reflective surface 85 after passing through the lens 81. The light reflected (totally reflected) by the peripheral reflective surface 85 reaches a peripheral emitting surface 86, provided on the periphery of the center emitting surface 83, after passing through the lens 81. Then, the yellowish white light is emitted to the outside of the lens 81 from the peripheral emitting surface 86. In this instance, the yellowish white light emitted in the side direction of the LED 80 and emitted to the outside from the peripheral emitting surface 86 is gathered at the center of an illumination region, and is mixed with the bluish white light, which is emitted in the front direction of the LED 80 and emitted to the outside from the center emitting surface 83. Therefore, it is possible to obtain white light in even tone (for example, please see Japanese Patent Laid-Open Publication No. 2005-216782 and U.S. Patent Publication No. 2005-179064, which are hereby incorporated in their entirety by reference).

The white light in the different tones emitted in the different directions of the LED 80 are mixed on the illumination surface and the unevenness in tone is resolved so that it is possible to obtain even white light. The white light in the different tones emitted from the different sections of the LED 80, however, are incident on the illumination surface as-is. In addition to this, they are magnified through an optical system in which the light emitting surface of the LED 80 is composed of the lens 81, so that the unevenness in tone is not resolved. As a result, white light with unevenness in tone is still emitted through the illumination surface.

SUMMARY

Accordingly, the presently disclosed subject matter has been devised in view of the foregoing and other problems and considerations. According to an aspect of the disclosed subject matter, a white LED illumination device can be provided which uses a white LED that has an unevenness in tone and which can irradiate even white light with high color rendering properties on an illumination surface.

According to another aspect of the presently disclosed subject matter, a white LED illumination device can include a white LED and an optical lens which are arranged so that optical axes of both are approximately aligned with each other. In this white LED illumination device, the white LED can have an LED chip which emits light having a peak wavelength in a predetermined wavelength range and a wavelength conversion material which is excited by the light emitted from the LED chip. The wavelength conversion material emits light via wavelength conversion which has a complementary color to a color of the light emitted from the LED chip. The optical lens can have a light incident surface for introduction of the light emitted from the white LED and can have a light emitting surface for emitting light to the outside. The light incident surface can include a convex portion with a convex surface that faces towards the white LED. The light emitting surface can include a convex portion with a center portion and a periphery portion thereof being formed into different shapes or curvatures.

In the white LED illumination device, the white LED can include a portion that emits white light of which the color is near the color of light of the LED chip and which is emitted from the center of the light emitting surface of the white LED. The white LED can also include a portion that emits white light of which the color is near a complementary color to the color of light of the LED chip and which is emitted from the periphery of the light emitting surface of the white LED. The light emitted from the center of the white LED is introduced into the optical lens through the convex surface of the light incident surface thereof, led through the optical lens, and is then emitted to the outside from the center of the convex portion of the light emitting surface. The light emitted from the periphery of the white LED is introduced into the optical lens through the convex surface of the light incident surface thereof, led through the optical lens, and is then emitted to the outside from the periphery of the convex portion of the light emitting surface. Furthermore, the white light of which the color is near the color of light of the LED chip and the white light of which color is near the complementary color to the color of light of the LED chip, both of which are emitted from the convex portion of the light emitting surface, are mixed to be applied on a surface to be illuminated.

According to another aspect of the presently disclosed subject matter, a white LED illumination device can include a white LED and an optical lens which are arranged so that optical axes of both are approximately aligned with each other. The white LED can include an LED chip which emits light having a peak wavelength in a predetermined wavelength range, a wavelength conversion material which is excited by the light emitted from the LED chip to emit light by wavelength conversion which has a complementary color to a color of the light emitted from the LED chip, and a light emitting surface. The optical lens can have a light incident surface for introduction of the light emitted from the white LED, a light emitting surface for emitting light to the outside, and a totally reflective surface for reflecting the light introduced from part of the light incident surface toward the light emitting surface. The light incident surface can have a recessed shape which faces the white LED. An inner bottom of the recessed shape can have a convex shape in part which faces the white LED. The light emitting surface can have a convex portion with a center portion and a periphery portion thereof being formed into different shapes or curvatures, and an approximately flat surface surrounding the convex portion. The totally reflective surface can have a curved surface that has a focus in the vicinity of an inner peripheral surface of the recessed portion of the light incident surface or in the vicinity of a periphery of the light emitting surface of the white LED.

The white LED can emit white light of which the color is near the color of light emitted by the LED chip and which is emitted from the center of the light emitting surface of the white LED, and white light of which the color is near the complementary color to the color of light emitted by the LED chip and which is emitted from the periphery of the light emitting surface of the white LED. Furthermore, part of the light emitted from the center of the white LED can be introduced into the optical lens through the convex surface of the inside bottom of the recessed portion of the light incident surface thereof, led through the optical lens, and emitted to the outside from the center of the convex portion of the light emitting surface. Part of the light emitted from the periphery of the white LED can be introduced into the optical lens through the convex surface of the inside bottom of the recessed portion of the light incident surface thereof, led through the optical lens, and emitted to the outside from the periphery of the convex portion of the light emitting surface. Then, the white light of which the color is near the color of light emitted by the LED chip and the white light of which the color is near the complementary color to the color of light emitted by the LED chip, both of which are emitted from the convex portion of the light emitting surface, can be mixed and directed to a surface to be illuminated. Also, part of the light emitted from the center of the white LED can be introduced into the optical lens through the inner peripheral surface of the recessed portion of the light incident surface thereof, led through the optical lens, reflected by the totally reflective surface, and emitted to the outside from the approximately flat surface surrounding the convex portion of the light emitting surface. Part of the light emitted from the periphery of the white LED can be introduced into the optical lens through the inner peripheral surface of the recessed portion of the light incident surface thereof, led through the optical lens, reflected by the totally reflective surface, and emitted to the outside from the approximately flat surface surrounding the convex portion of the light emitting surface. Then, the white light of which the color is near the color of light emitted by the LED chip and the white light of which the color is near the complementary color to the color of light emitted by the LED chip, both of which are emitted from the approximately flat surface surrounding the convex portion of the light emitting surface, can be mixed and directed to a surface to be illuminated.

It should be appreciated that, in any of the abovementioned white LED illumination devices, the LED chip can emit light having a peak wavelength in a blue wavelength range, and the wavelength conversion material can be excited by the blue light and can emit yellow or yellowish green light by wavelength conversion.

According to an aspect of the disclosed subject matter, a white LED and an optical lens are arranged so that the optical axes of both are substantially aligned with each other. The white LED can include an LED chip which emits light having a peak wavelength in the blue wavelength range and a wavelength conversion material such as a fluorescent material which can be excited by the light emitted from the LED chip and can emit via wavelength conversion yellow or yellowish green fluorescence which are complementary colors of blue. The optical lens can include a convex light incident surface and a convex light emitting surface for which the center and periphery thereof can be formed into different shapes or curvatures.

The bluish white light can be emitted from the center of the light emitting surface of the LED and the yellowish white light can be emitted from the periphery of the light emitting surface of the LED. The bluish and/or yellowish white light introduced into the lens from the convex surface of the light incident surface of the optical lens can be emitted to the outside from the convex portion of the light emitting surface and then mixed.

As a result, the white light in both tones is gathered into a single route of optical path and mixed, so that the light directed to an illumination surface becomes white light with high color rendering properties and with less unevenness in tone.

Furthermore, according to another aspect of the disclosed subject matter, a white LED and an optical lens can be arranged so that the optical axes of both are substantially aligned with each other. The white LED can include an LED chip which emits light having a peak wavelength in a blue wavelength range and a wavelength conversion material such as a fluorescent material which is excited by the light emitted from the LED chip and which can emit via wavelength conversion yellow or yellowish green fluorescence which are complementary colors of blue. The optical lens can include: a recessed light incident surface having a convex inside bottom with a convex surface; a light emitting surface composed of a convex portion with center and periphery portions being formed into different shapes or curvatures and a flat surface surrounding the convex section; and a totally reflective surface made of a curved surface having a focal point in the vicinity of an inner peripheral surface of the recessed portion of the light incident surface or in the vicinity of the periphery of the light emitting surface of the white LED.

Of the bluish white light emitted from the center of the light emitting surface of the LED and the yellowish white light emitted from the periphery of the light emitting surface of the LED, the bluish and/or yellowish white light that is introduced into the lens via the convex surface of the inside bottom of the recessed portion of the light incident surface of the optical lens can be emitted to the outside from the convex portion of the light emitting surface and then mixed. The bluish and/or yellowish white light introduced into the interior of the lens via the inner peripheral surface of the recessed portion of the light incident surface of the lens can be reflected by the totally reflective surface, emitted to the outside from the flat surface of the light emitting surface, and mixed together.

As a result, white light that includes both tones can be gathered into a single route of optical path and mixed, so that the light directed to the illumination surface becomes white light with high color rendering properties and with less unevenness in tone.

BRIEF DESCRIPTION OF THE DRAWINGS

These and other characteristics, features, and advantages of the disclosed subject matter will become clear from the following description with reference to the accompanying drawings, wherein.

DESCRIPTION OF EXEMPLARY EMBODIMENTS

Hereinafter, exemplary embodiments of the presently disclosed subject matter will be described in detail with referring to FIGS. 3 to 6 (the same reference numbers refer to identical and/or similar structures or references). The exemplary embodiments described herein are specific examples of the presently disclosed subject matter, and thus various technical features are included. However, the scope of the present invention is not limited to these embodiments.

Figure 3:
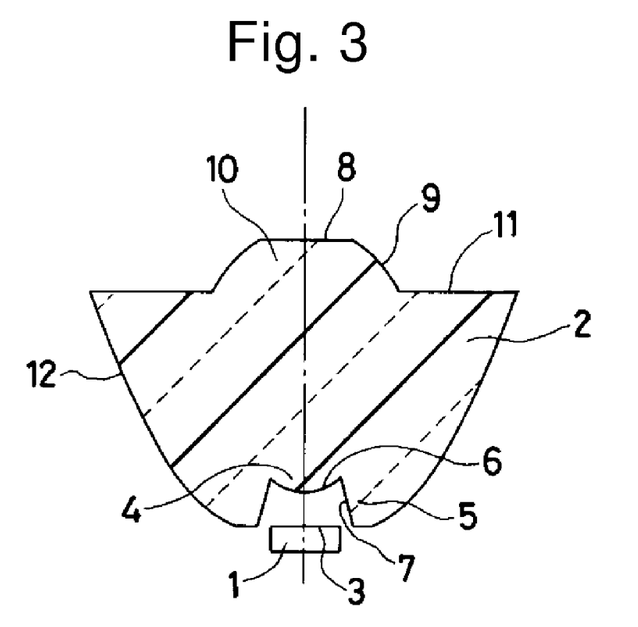
FIG. 3 is a sectional view of an exemplary embodiment of a white LED illumination device made in accordance with principles of the presently disclosed subject matter.

FIG. 3 is a sectional view showing parts of a white LED illumination device according to an exemplary embodiment of the presently disclosed subject matter. The exemplary embodiment includes a white LED 1 and an optical lens 2. The optical lens 2 can include an optical system that is configured to control an optical path of light emitted from the white LED 1. The white LED 1 can be disposed above the white LED 1 in a light emission direction. In this instance, the optical axis of the white LED 1 approximately coincides with that of the optical lens 2.

In this case, when viewed as a whole, the white LED (hereinafter abbreviated as "LED") 1, as shown in FIG. 3, emits bluish white light in a front direction and yellowish white light in a slanting upward direction. When viewed in detail, the LED emits the bluish white light from the center of a light emitting surface of the LED and the yellowish white light from the periphery of the light emitting surface of the LED. Thus, the LED has an optical characteristic with unevenness in tone because the emitted white light has different tones according to emission direction and emission portions in the light emitting surface of the LED.

The optical lens 2 can have a convex portion 4 opposed to a light emitting surface 3 of the white LED 1 such that a convex surface 6 faces towards the LED 1 and a wall portion 5 protrudes to/from an edge of the convex portion 4. The convex surface 6 of the convex portion 4 can serve as a light incident surface through which light that is emitted upward from the light emitting surface 3 of the LED 1 is introduced into the optical lens 2. An inner peripheral surface 7 of the wall portion 5 can serve as a light incident surface which introduces light that is emitted sideways from the light emitting surface 3 of the LED 1 into the optical lens 2. A light emitting surface that is configured to emit light to the outside can be formed at a position opposed to the convex portion 4 of the light incident surface of the optical lens 2. A convex portion 10 can be formed at the center of the light emitting surface. The convex portion 10 can have an approximately flat surface 8 in the center thereof and part of an approximately ellipsoid of revolution 9 having a focus in the vicinity of the convex portion 4. An approximately flat surface 11 can be located about the periphery of the convex portion 10.

The curvature of the convex portion serving as the light emitting surface can be smaller than the curvature of the convex portion serving as the light incident surface in general. This is because the light emitting surface of the LED optically conjugates with the convex portion serving as the light emitting surface of the optical lens, and the convex surface serving as the light incident surface optically conjugates with an illumination pattern. Thus, the optical lens can be described as a biconvex lens.

Furthermore, it is possible to make the curvature and shape different between the center and the periphery of the convex portion which serves as the light emitting surface. If the curvatures are made different, the center may be designed so as to have a curvature for controlling the bluish white light, and the periphery may be designed so as to have a curvature for controlling the yellowish white light. The shapes are made different in this exemplary embodiment. For example, the center of the convex portion 10 is formed into the approximately flat surface 8 to diffuse the bluish white light. The periphery is composed of part of the approximately ellipsoid of revolution 9 having a focus in the vicinity of the convex portion 4 in which the convex surface 6 serving as a light incident surface is formed in order to concentrate the yellowish white light towards the center.

The shape of an outside surface 12 can be a reflective (e.g., totally reflective) surface for directing the light that is led into the optical lens 2 to the light emitting surface. The shape of surface 12 is not limited to that of the convex portion 10, and can be variously changeable. Various characteristics of the shape of the outside surface 12 will be hereinafter described.

In the case of realizing an optical lens with relatively high light-gathering power, the outside surface 12 of the optical lens 2 can be formed by an approximately parabolic curve as viewed in cross section. In this case, when a focus position is set in the vicinity of the light emitting surface 3 of the LED 1, the light emitting surface 3 of the LED 1 is formed as an image on the illumination surface as-is, and hence unevenness in tone existing in the light emitting surface 3 of the LED 1 conspicuously appears on the illumination surface. Accordingly in this exemplary embodiment, the focus position of the outside surface 12 of the optical lens 2 is set to be located in the vicinity of the inner peripheral surface 7 of the wall portion 5. In this instance, the shape of the inner peripheral surface 7 of the wall portion 5 is projected on the illumination surface. Since the wall portion 5 can be several mm away from the light emitting surface 3 of the LED 1, the light emitted from the light emitting surface 3 of the LED 1 reaches the illumination surface in a condition with little unevenness in tone. Therefore, the light without unevenness in tone is applied on the illumination surface on which the inner peripheral surface 7 of the wall portion 5 is projected.

Figure 4:
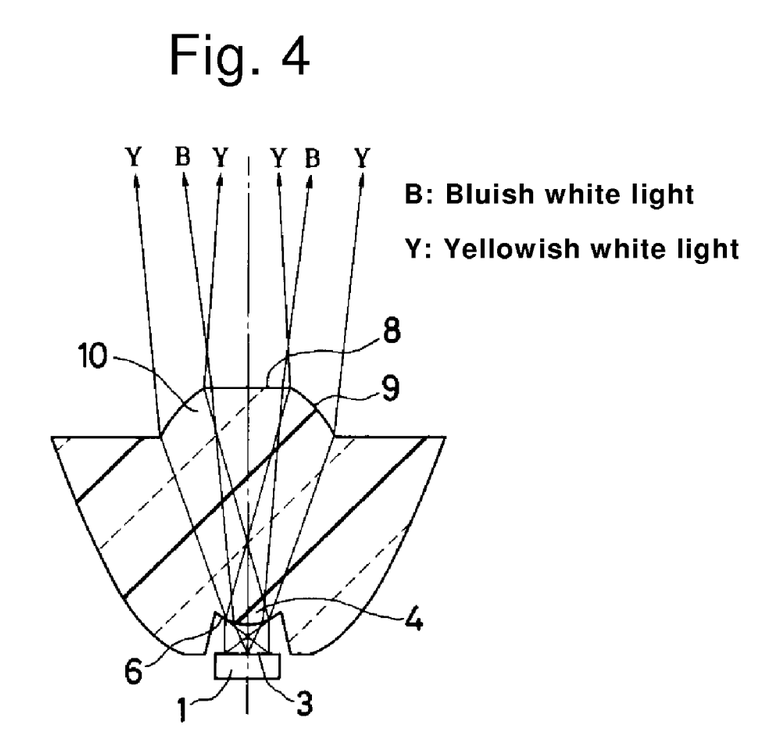
FIG. 4 is a drawing showing tracks of light rays according to the exemplary embodiment of the white LED illumination device of FIG. 3.
Figure 5:
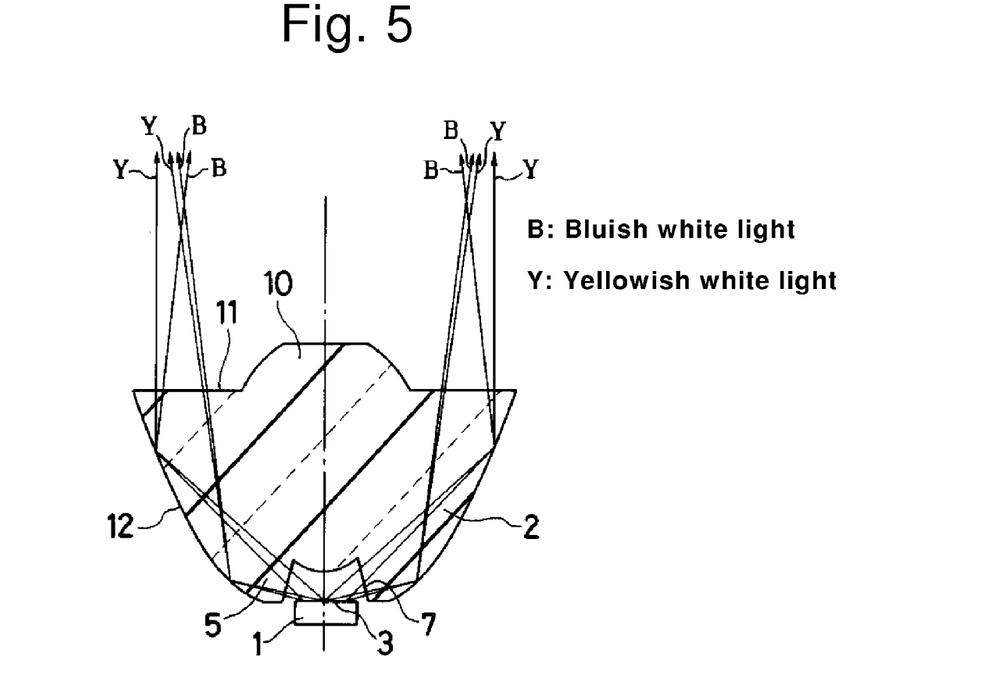
FIG. 5 is another drawing showing tracks of light rays according to the exemplary embodiment of the white LED illumination device of FIG. 3.

FIGS. 4 and 5 are sectional views of the exemplary embodiment of FIG. 3. FIGS. 4 and 5 show exemplary tracks of both the bluish white light that is emitted from the center of the light emitting surface 3 of the LED 1 and the yellowish white light that is emitted from the periphery of the light emitting surface 3 of the LED 1. Both types of light can be introduced into the lens 2 via the light incident surface of the optical lens 2, led through the optical lens 2, and emitted to the outside from the light emitting surface.

With regard to the bluish white light emitted from the center of the light emitting surface 3 of the LED 1, as shown in FIG. 4, light heading for the convex surface 6 of the convex portion 4 of the optical lens 2 on the side of the light emitting surface 3 of the LED 1 can be refracted by the convex surface 6 and introduced into the optical lens 2 while being gathered. The light is led through the optical lens 2, and reaches the approximately flat surface 8 in the center of the convex portion 10 formed in the center of the light emitting surface. Then, the light is emitted to the outside while diffused by the approximately flat surface 8. With regard to the yellowish white light emitted from the periphery of the light emitting surface 3 of the LED 1, light heading for the convex surface 6 of the convex portion 4 of the optical lens 2 on the side of the light emitting surface 3 of the LED 1 is refracted by the convex surface 6 and introduced into the optical lens 2 in a like manner. The light is led through the optical lens 2, and reaches the approximately ellipsoid of revolution 9 on the periphery of the convex portion 10 formed in the center of the light emitting surface. Then, the light is emitted to the outside while being refracted by the approximately ellipsoid of revolution 9. The light is gathered at the upper portion of the center of the convex portion 10.

As a result, the bluish white light emitted from the approximately flat surface 8 of the convex portion 10 formed in the center of the light emitting surface of the optical lens 2 is mixed with the yellowish white light emitted from the approximately ellipsoid of revolution 9 in the upper portion of the center of the convex portion 10, so that white light with high color rendering properties is formed.

Accordingly, the above-described exemplary embodiment uses a biconvex lens that is formed only by two convex portions, that is, the convex portion 4 of the optical lens 2 on the side of the light emitting surface 3 of the LED 1 and the convex portion 10 formed in the center of the light emitting surface. This biconvex lens can provide white light with high color rendering properties by mixing the bluish white light emitted from the center of the light emitting surface 3 of the LED 1 and the yellowish white light emitted from the periphery of the light emitting surface 3 of the LED 1.

As shown in FIG. 5, the bluish white light emitted from the center of the light emitting surface 3 of the LED 1 that is directed towards the inner peripheral surface 7 of the wall portion 5 of the optical lens 2 is introduced into the optical lens 2 from the inner peripheral surface 7, and heads for the outside surface 12 that is shown as being formed by an approximately parabolic curve in cross section. When the light is led through the optical lens 2, and reaches the outside surface 12 through the optical lens 2, the light can be totally reflected by the outside surface 12 and head for the light emitting surface. Then, the light reaches the approximately flat surface 11 located around the convex portion 10 that is formed in the light emitting surface. Then, the light is emitted to the outside while being diffused by the approximately flat surface 11.

By contrast, the yellowish white light that is emitted from the periphery of the light emitting surface 3 of the LED 1 and is directed towards the inner peripheral surface 7 of the wall portion 5 of the optical lens 2 can be emitted to the outside through approximately the same optical path as the above-described bluish white light which is emitted from the center of the light emitting surface 3 and also directed towards the inner peripheral surface 7 of the wall portion 5 of the optical lens 2.

As a result, in an upper portion of the periphery of the convex portion 10 that is formed in the light emitting surface, the bluish white light and the yellowish white light which are emitted from the approximately flat surface 11 around the convex portion 10 that is formed in the center of the light emitting surface of the optical lens 2 are mixed, and hence white light with high color rendering properties can be formed.

Accordingly, the above-described light path uses only three portions (surfaces) of an optical lens, that is, the inner peripheral surface 7 of the wall portion 5 of the optical lens 2, the approximately flat surface 11 around the convex portion 10 formed in the light emitting surface, and the outside surface 12. This optical lens can provide the white light with high color rendering properties by mixing the bluish white light emitted from the center of the light emitting surface 3 of the LED 1 with the yellowish white light emitted from the periphery of the light emitting surface 3 of the LED 1.

Thus, overlaying the tracks of light rays shown in FIGS. 4 and 5, the white light with high rendering properties, into which the bluish white light and the yellowish white light are mixed, can be formed above both of the center and periphery of the optical lens 2 (that is, above the whole optical lens 2). Accordingly, this LED illumination device can emit white light with high rendering properties and with little unevenness in tone from the illumination surface.

Figure 6:
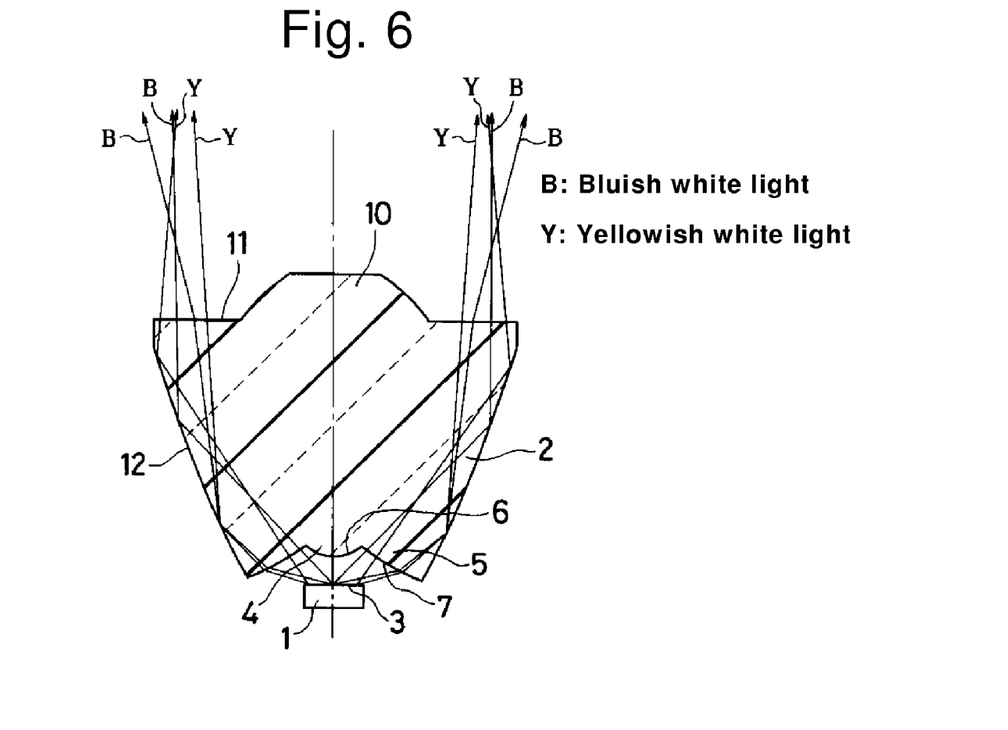
FIG. 6 is a drawing showing tracks of light rays according to another embodiment of a white LED illumination device made in accordance with principles of the presently disclosed subject matter.

FIG. 6 shows another exemplary embodiment which can realize an LED white light emitting device with higher converging properties. The optical lens of FIG. 6 has almost the same shape as the optical lens shown in FIGS. 3 to 5, but the height of the optical lens 2 is made higher than the optical lens in the previously described embodiment. In addition, the inner peripheral surface 7 of the wall portion 5 is inclined towards a direction that is parallel to the light emitting surface 3 of the LED 1 (the inner peripheral surface 7 can be extended to be substantially horizontal).

When the focus of the outside surface 12 of the optical lens 2 serving as the totally reflective surface is set at the center of the light emitting surface 3 of the LED 1, the bluish white light and the yellowish white light are separated. Therefore, the present exemplary embodiment sets the focus thereof in the vicinity of the periphery of the light emitting surface 3 of the LED 1.

By inclining the inner peripheral surface 7 of the wall portion 5 to the direction parallel to the light emitting surface 3 of the LED 1, light, which is emitted from the light emitting surface 3 of the LED 1 and refracted by the inner peripheral surface 7 of the wall portion 5, is introduced into the optical lens 2. Then, the light is led through the optical lens 2, and reaches an end portion of the outside surface 12. In other words, since an optical path of the light that is emitted from the light emitting surface 3 of the LED 1 and which extends to the light emitting surface of the optical lens 2 becomes long, the light emitted from the light emitting surface of the optical lens 2 to the outside forms a narrow directional orientation pattern.

The directivity of light emitted above the center of the optical lens 2 depends on both the focal length of the convex portion 10 that is formed in the light emitting surface of the optical lens 2 and the curvature of the convex surface 6 of the convex portion 4 located adjacent the light emitting surface 3 of the LED 1. Therefore, increasing the height of the optical lens 2 makes it possible to realize an LED white light emitting device that has narrow directivity.

The white LED has not been described in detail. However, the kind of the white LED is not limited to any particular one, and combinations of particular color tone LED chip and corresponding wavelength conversion materials may be used, as appropriate.

While there has been described what are at present considered to be exemplary embodiments of the present invention, it will be understood that various modifications may be made thereto, and it is intended that the appended claims cover such modifications as fall within the true spirit and scope of the present invention.

What is claimed is:

1. A white LED illumination device, comprising:
   a white LED configured to emit light along an LED optical axis in a light emitting direction and including an LED chip; and
   an optical lens having a lens optical axis that is substantially aligned with the LED optical axis, wherein
   the LED chip is configured to emit light having a peak wavelength in a predetermined wavelength range associated with a particular color and includes a wavelength conversion material which is excitable by the light emitted from the LED chip, and when the wavelength conversion material is excited by the light emitted from the LED chip the wavelength conversion material emits light which has a complementary color to the particular color of the light emitted from the LED chip, and
   the optical lens has a light incident surface configured to receive the light emitted from the white LED and a light emitting surface configured to emit light to the outside, the light incident surface having a convex surface facing towards the white LED, the light emitting surface facing away from the LED chip and in the light emitting direction and having a convex portion with a center portion having a first shape and a periphery portion having a second shape, the first shape being different from the second shape, wherein the white LED includes a light emitting surface that has a center area and a peripheral area, the white LED is configured to emit white light that has a color that is near the particular color of light associated with the LED chip from the center area of the light emitting surface of the white LED, the white LED is also configured to emit white light that has a color that is near the complementary color from the peripheral area of the light emitting surface of the white LED,
   the white LED and optical lens are configured such that light emitted from the center area of the white LED is introduced into the optical lens through the convex surface of the light incident surface of the optical lens, transmits through the optical lens, and is emitted to the outside from the center portion of the convex portion of the light emitting surface,
   the white LED and optical lens are configured such that light emitted from the peripheral area of the white LED is introduced into the optical lens through the convex surface of the light incident surface of the optical lens, transmits through the optical lens, and is emitted to the outside from the periphery portion of the convex portion of the light emitting surface, and
   the white LED and optical lens are configured such that the white light that has a color that is near the particular color of light associated with the LED chip and the white light that has a color that is near the complementary color are emitted from the convex portion of the light emitting surface of the optical lens and are mixed.

2. The white LED illumination device according to claim 1, wherein the LED chip is configured to emit blue light having a peak wavelength in a blue wavelength range, and the wavelength conversion material is configured to be excited by the blue light and to emit at least one of yellow and yellowish green light by wavelength conversion of the blue light.

3. The white LED illumination device according to claim 1, wherein the LED chip is configured to emit blue light having a peak wavelength in a blue wavelength range, and the wavelength conversion material is configured to be excited by the blue light and to emit at least one of yellow and yellowish green light by wavelength conversion of the blue light.

4. The white LED illumination device according to claim 1, wherein the first shape is a substantially flat shape facing away from the LED chip and the second shape is a substantially convex shape facing away from the LED chip.

5. A white LED illumination device, comprising:
   a white LED configured to emit light along an LED optical axis and including an LED chip; and
   an optical lens having a lens optical axis that is substantially aligned with the LED optical axis, wherein
   the LED chip is configured to emit light having a peak wavelength in a predetermined wavelength range associated with a particular color and includes a wavelength conversion material which is excitable by the light emitted from the LED chip, and when the wavelength conversion material is excited by the light emitted from the LED chip the wavelength conversion material emits light which has a complementary color to the particular color of the light emitted from the LED chip, and the LED chip includes an LED light emitting surface,
   the optical lens has a light incident surface configured to receive the light emitted from the white LED, a light emitting surface configured to emit light to the outside, and a totally reflective surface configured to reflect light received from a part of the light incident surface and direct the light toward the light emitting surface of the optical lens,
   the light incident surface has a recessed shape facing towards the white LED, and an inner bottom of the recessed shape includes a convex shape facing towards the white LED,
   the light emitting surface has a convex portion with a center portion and a periphery portion, the light emitting surface including an approximately flat surface located about the convex portion, and
   the totally reflective surface has a curved surface with a focus located substantially at at least one of an inner peripheral surface of the recessed shape of the light incident surface and a periphery of the light emitting surface of the white LED.

6. The white LED illumination device according to claim 5, wherein the white LED is configured to emit white light that has a color that is near the particular color of light associated with the LED chip from a central portion of the light emitting surface of the white LED, the white LED is also configured to emit white light that has a color that is near the complementary color from a peripheral portion of the light emitting surface of the white LED,
   the white LED and optical lens are configured such that at least a part of light emitted from a center area of the white LED is introduced into the optical lens though the convex shape of the inner bottom of the recessed shape of the light incident surface, transmits though the optical lens, and is emitted to the outside from the center portion of the convex portion of the light emitting surface,
   the white LED and optical lens are configured such that at least part of light emitted from a peripheral area of the white LED is introduced into the optical lens through the convex shape of the inner bottom of the recessed shape of the light incident surface, transmits through the optical lens, and is emitted to the outside from the periphery portion of the convex portion of the light emitting surface,
   the white LED and optical lens are configured such that the white light that has a color that is near the particular color of light associated with the LED chip and the white light that has a color that is near the complementary color are emitted from the convex portion of the light emitting surface of the optical lens and are mixed, the white LED and optical lens are configured such that at least part of the light emitted from the center area of the white LED is introduced into the optical lens though the inner peripheral surface of the recessed shape of the light incident surface of the optical lens, transmits though the optical lens, is reflected by the totally reflective surface, and is emitted to the outside from the approximately flat surface of the light emitting surface, the white LED and optical lens are configured such that part of the light emitted from the periphery portion of the white LED is introduced into the optical lens though the inner peripheral surface of the recessed shape of the light incident surface of the optical lens, transmits though the optical lens, is reflected by the totally reflective surface, and is emitted to the outside from the approximately flat surface of the light emitting surface, and the white LED and optical lens are configured such that the white light that has a color that is near the particular color of light associated with the LED chip and the white light that has a color that is near the complementary color are emitted from the approximately flat surface of the light emitting surface and are mixed.

7. The white LED illumination device according to claim 6, wherein the LED chip is configured to emit blue light having a peak wavelength in a blue wavelength range, and the wavelength conversion material is configured to be excited by the blue light and to emit at least one of yellow and yellowish green light by wavelength conversion of the blue light.

8. The white LED illumination device according to claim 5, wherein the LED chip is configured to emit blue light having a peak wavelength in a blue wavelength range, and the wavelength conversion material is configured to be excited by the blue light and to emit at least one of yellow and yellowish green light by wavelength conversion of the blue light.

9. A white LED illumination device, comprising:
a white LED configured to emit light, the white LED including an LED chip and having an LED optical axis; and
an optical lens having an optical axis that is substantially aligned with the LED optical axis, wherein
the LED chip is configured to emit a particular color light and includes a wavelength conversion material which is excitable by the particular color light to emit a different colored light, and
the optical lens has a light incident surface having a convex portion that faces towards the white LED, and a light emitting surface that faces away from the white LED and is configured to emit light to the outside, the light emitting surface having a convex portion and a substantially flat surface located about the convex portion, and the light incident surface of the optical lens includes a peripheral surface that extends from a perimeter of the convex portion of the light incident surface and is located closer to the white LED than the convex portion of the light incident surface.

10. The white LED illumination device of claim 9, wherein the convex portion is located at a substantial center of the substantially flat surface.

11. The white LED illumination device of claim 9, wherein the optical lens includes a totally reflective surface that extends continuously from the light emitting surface to the light incident surface.

12. The white LED illumination device of claim 11, wherein the totally reflective surface extends continuously from an outermost portion of the peripheral surface of the light incident surface closest to the white LED to the substantially flat surface of the light emitting surface.

13. A white LED illumination device, comprising:
a white LED configured to emit light along an LED optical axis in a light emitting direction and including an LED chip; and
an optical lens having a lens optical axis that is substantially aligned with the LED optical axis, wherein
the LED chip is configured to emit light having a peak wavelength in a predetermined wavelength range associated with a particular color and includes a wavelength conversion material which is excitable by the light emitted from the LED chip, and when the wavelength conversion material is excited by the light emitted from the LED chip the wavelength conversion material emits light which has a complementary color to the particular color of the light emitted from the LED chip, and the optical lens has a light incident surface configured to receive the light emitted from the white LED and a light emitting surface configured to emit light to the outside, the light incident surface having a convex portion with a convex surface facing towards the white LED, the light emitting surface facing away from the LED chip and in the light emitting direction and having a convex portion with a center portion having a first shape and a periphery portion having a second shape, the first shape being different from the second shape, wherein the first shape is a substantially flat shape facing away from the LED chip and the second shape is a substantially convex shape facing away from the LED chip, wherein the convex portion of the light emitting surface includes a substantially flat center surface surrounded by a substantially convex curved peripheral portion.

* * * * *